United States Patent [19]

Gauthier et al.

[11] Patent Number: 4,952,795
[45] Date of Patent: Aug. 28, 1990

[54] CURRENT LIMITER AND AN OPTICAL RECEIVER MAKING USE THEREOF

[75] Inventors: Claude Gauthier, Bouville; Guy Balland, Paris, both of France

[73] Assignee: Societe Anonyme dite : ALCATEL CIT, Paris, France

[21] Appl. No.: 458,268

[22] Filed: Dec. 29, 1989

[30] Foreign Application Priority Data

Dec. 30, 1988 [FR] France .................................. 88 17508

[51] Int. Cl.[5] .......................... H01J 40/14; H03K 5/08
[52] U.S. Cl. .................................. 250/214 A; 307/565
[58] Field of Search ........... 250/214 R, 214 A, 214 C, 250/551; 307/311, 540, 559, 561, 565, 259, 317.1, 317.2; 455/619

[56] References Cited

U.S. PATENT DOCUMENTS

| | | | |
|---|---|---|---|
| 3,125,693 | 3/1964 | De Clue | 250/214 R |
| 3,248,569 | 4/1966 | Weekes . | |
| 3,519,828 | 7/1970 | Milford | 250/214 R |
| 3,958,175 | 5/1976 | Braun | 307/311 |
| 4,037,115 | 2/1977 | Lee | 307/317.2 |
| 4,096,382 | 6/1978 | Numata et al. . | |
| 4,348,586 | 9/1982 | Kokorowski | 455/619 |
| 4,423,330 | 12/1983 | El Hamamsy | 250/551 |
| 4,473,745 | 9/1984 | Chown | 250/214 R |
| 4,498,197 | 2/1985 | Chown | 250/214 R |
| 4,590,417 | 5/1986 | Tangami et al. | 307/561 |
| 4,675,551 | 6/1987 | Stevenson et al. | 307/561 |
| 4,683,443 | 7/1987 | Young et al. . | |
| 4,746,821 | 5/1988 | Norton . | |

FOREIGN PATENT DOCUMENTS

8804867 6/1988 World Int. Prop. O. ........... 455/619

OTHER PUBLICATIONS

Electronics, vol. 44, No. 4, Feb. 1971, p. 87; R. J. Turner: "Series Limiter Tracks Signal, Finds Symmetry".

Primary Examiner—David C. Nelms
Assistant Examiner—Michael Messinger
Attorney, Agent, or Firm—Sughrue, Mion, Zinn, Macpeak & Seas

[57] ABSTRACT

A current limiter circuit receiving an input current having a non-zero DC component whose value lies in a wide range of current values, and delivering a limited output current whose value lies in a narrower range of current values. The limiter comprises a series connection of a first asymmetrical conductivity element followed by a second asymmetrical conductivity element which is followed in turn by a resistive element, the series connection extending between two poles of a voltage source so that a bias current flows through the asymmetrical conductivity elements and makes them conductive. The input current is applied to the common point between the two asymmetrical conductivity elements and the current-limited output is taken from the common point between the second asymmetrical conductivity element and the resistive element. The direction of the input current flow is such that it splits into two fractions, with one of the fractions being subtracted from the bias current in the second asymmetrical conductivity element, while the other fraction is added to the bias current in the first asymmetrical conducitivity element, thereby increasing the dynamic resistance of the second asymmetrical conductivity element and reducing the dynamic resistance of the asymmetrical conductivity element, thus limiting the output current.

4 Claims, 1 Drawing Sheet

CURRENT LIMITER AND AN OPTICAL RECEIVER MAKING USE THEREOF

The present invention relates to a current limiter circuit which is useable, in particular, in the input circuit of a preamplifier in a receiver for an optical link.

BACKGROUND OF THE INVENTION

A link of this type is described, for example, in the article "Système urbain de transmission sur fibre optique unimodale à 140 et 34 Mbit/s (FOT140/34)" (A local monomode optical fiber transmission system at 140 Mbit/s and at 34 Mbit/s (FOT140/34)), published by D. Betoule et al. in the journal "Commutation et transmission," No. 2, 1988. This article also gives some information about the receiver, which receiver includes, for opto-electrical conversion, an avalanche photodiode (PDA) whose gain is controlled by an automatic level-controlling loop. Thereafter, the signal is amplified linearly by means of a low noise transimpedance stage. More precisely, it is specified that depending on the application, the attenuation along the optical fiber link between the transmitter and the receiver may lie within the range 0 dB to 28 dB, with the corresponding dynamic range at the receiver being obtained, on commissioning, by choosing between two operating ranges.

In such a link, when the attenuation is 28 dB, the received signal is weak. This requires low noise amplification. Gain must also be relatively high for the purpose of subsequent processing of the signal. However the attenuation may be only 0 dB if the link is extremely short or if the transmitter of an transmission link is looped directly to the receiver of the associated reception link for test purposes. If no precautions are taken, the photodiode used is in danger of providing a signal lying outside the operating range of the preamplifier, thereby making the link unuseable.

In addition to the case dealt with in the above-mentioned publication, various other solutions have also been provided to this problem.

Thus, proposals have been made to use an element which attenuates the light signal received by the photodiode, this element being in the form of an optical attenuator such as that constituting the subject matter of French patent document FR-A-85 17 277, or more simply merely adding an extra length of optical fiber. Such solutions are expensive and require human intervention during commissioning which makes them unacceptable in some applications.

In the article mentioned above, it is the sensitivity of the photodiode which is reduced by acting on its bias current. Another illustration of this type of solution is to be found in PCT patent document WO-A-85/04997. The variation in dynamic range obtained by such means is insufficient for satisfying requirements. In addition, in the article in question, it is mentioned that a dynamic range is selected during commissioning which means that it is unsuitable for solving the problem posed by tests which are performed by looping the transmitter back to the receiver without human intervention then being necessary.

Proposals have also been made to act on the dynamic range of the preamplifier. One such solution is illustrated, for example, by the transimpedance amplifier type TIA 1500 provided by the American firm MSC, Microwave Semiconductor Corp. Here too, the amplifier is limited with respect to variations in dynamic range. In addition, an amplifier that is modified in this way is relatively expensive.

The object of the present invention is to improve the operating dynamic range of an optical receiver having a current-generating photodetector and a low impedance electrical amplification stage in such a manner as to satisfy, in particular, the needs mentioned above, with this being achieved solely by use of means which are simple, cheap, and do not require human intervention.

To do this, the present invention proposes a current limiter circuit which, when applied to such a receiver, is interposed between the photodiode and the said amplification stage, and serves to limit the current applied to said stage, thereby preventing the applied current from going outside the operating range of the stage when the light signal received by the photodiode is at a high level. Naturally, such a limiter circuit can also be used in any similar application.

SUMMARY OF THE INVENTION

The present invention thus provides firstly a current limiter circuit receiving an input current having a non-zero DC component whose value lies in an extended range of current values, and which delivers a limited output current whose value lies in a narrow range of current values.

The current limiter circuit of the invention which is effective over a wide range of input currents while never-the-less being simple and cheap to implement, comprises a series connection of a first asymmetrical conductivity element followed by a second asymmetrical conductivity element which is followed in turn by a resistive element, the series connection extending between two poles of a voltage source so that a bias current flows through the asymmetrical conductivity elements and makes them conductive, with the input current being applied to the common point between the two asymmetrical conductivity elements and with the current-limited output being taken from the common point between the second asymmetrical conductivity element and the resistive element, the direction of the input current flow being such that it splits into two fractions, with one of the fractions being subtracted from the bias current in the second asymmetrical conductivity element, while the other fraction is added to the bias current in the first asymmetrical conductivity element, thereby increasing the dynamic resistance of the second asymmetrical conductivity element and reducing the dynamic resistance of the asymmetrical conductivity element, thus limiting the output current.

The said asymmetrical conductivity elements may be Schottky diodes. Advantageously, the diodes are paired.

The present invention also provides an optical receiver having a photodiode which converts an incident optical signal into an electrical signal in the form of a current which it delivers to a low impedance amplification stage for the electrical signal, said receiver making use of the current limiter circuit of the invention. The limiter circuit is interposed between the photodiode and the amplification stage to which its output current is applied, while its input current is directly constituted by the current delivered by the photodetector.

BRIEF DESCRIPTION OF THE DRAWINGS

An embodiment of the invention is described by way of example with reference to the accompanying drawings, in which.

DETAILED DESCRIPTION

In the figure, there can be seen a photodetector PDA of the current-generating type, i.e. it responds to an incident optical signal by delivering an electrical signal in the form of a current. The photodetector in this case is an avalanche photodiode. It may be constituted by the component sold by Alcatel CIT under reference CG4100. The cathode of this photodiode is connected to a positive potential +Vd via a bias resistor R1.

Its cathode is also connected to a potential +V1 which is less than Vd, via a diode DP in order to ensure that it receives minimum bias voltage regardless of the voltage drop across the resistor R1, thereby avoiding any reduction in its pass band. This bias circuit is decoupled by a capacitor CP connected between the cathode of the photodiode DPA and ground.

The anode of the photodiode is connected to a current input terminal A of a current limiter circuit constituted by two asymmetrical conductivity elements D1 and D2 and a resistive element or resistor RP. The limiter circuit has an output terminal B for limited current which is connected via a capacitor C to an amplifier PA provided with a feedback impedance RC. The amplifier PA together with the impedance RC constitutes a transimpedance preamplifier. Such a transimpedance amplifier is available under the reference ATA30010 from the American manufacturer Anadigics.

Under the effect of light flux $\phi$, the photodiode delivers current which increases with increasing light flux. The current flowing through the diode PDA is the input current applied to the limiter circuit constituted by the elements D1, D2, and RP. In response, the limiter circuit provides a limited output current to the capacitor C and to the amplifier PA. The current flowing in this way through the capacitor C is amplified by the amplifier PA.

The range of input currents which the diode PDA can produce is wide, whereas the acceptable input dynamic range for the preamplifier PA in order to ensure proper operation is narrower. The purpose of the limiter circuit is to cause each input current to correspond to an output current, with the range of input currents being wide and corresponding to the range of currents produced by the photodiode PDA, while the range of output currents is more limited and remains within the operating range of the amplifier PA.

The limiter circuit constituted by the elements RP, D2, and D1 is connected between two terminals of a source of bias voltage, one of which provides a potential +V, and the other of which is grounded, such that the three elements in series convey a bias current ip. The resistor RP is connected between the terminal providing the potential +V and the terminal B, asymmetrical conductivity element D2 is connected between the terminals B and A, and asymmetrical conductivity element D1 is connected between the terminal A and ground.

Figure 1:
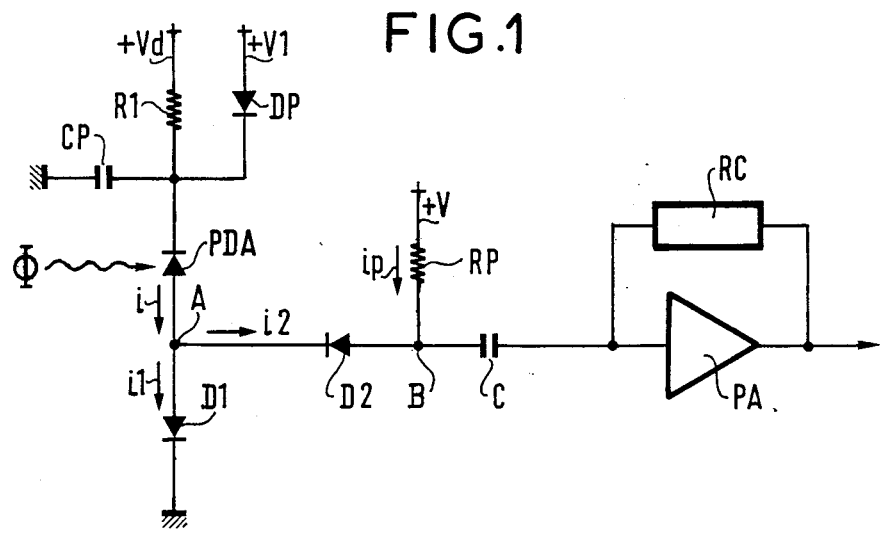
FIG. 1 is a circuit diagram of the reception circuit in an optical link including a limiter circuit of the invention.
Figure 2:
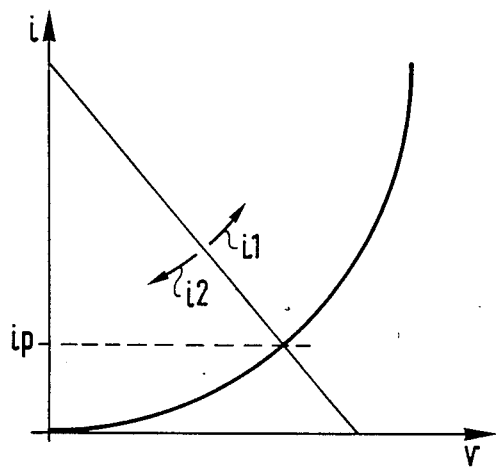
FIG. 2 is a voltage/current characteristic curve for the diodes in the limiter circuit of FIG. 1.

The asymmetrical conductivity elements D1 and D2 are preferably Shottky diodes whose current/voltage characteristic is given in FIG. 2. This figure shows a load line corresponding to the case where only the current ip is flowing through the diodes. As can be seen, the dynamic resistance of the diode (dv/di, i.e. the reciprocal of the slope of the curve) reduces as the current increases. In the absence of any other current flow, the dynamic resistances of the two diodes are equal since they have the same current flowing through both of them.

The limited circuit receives the current flowing through the photodiode PDA at terminal A between the diodes D1 and D2. This current comprises an AC component and a DC component representative of the peak-to-peak amplitude of the AC component e.g. equal to half said amplitude, as is often the case. In this case, the current splits into two portions: i2 flowing through the diode D2, and i1 flowing the diode D1. The capacitor C prevents the DC component being transmitted to the amplifier PA, so the output current from the limiter delivered to the amplifier PA is taken solely from the current i2, and more precisely, the current applied to the amplifier PA is constituted substantially by the AC component of the current i2. Naturally the capacitance of the capacitor C is chosen so as to pass the signals from the photodiode PDA without attenuating them. The current i2 is subtracted from the bias current flowing through the diode D2 whereas the current i1 is added to the bias current flowing through the diode D1. The effect of the input current i is indicated in FIG. 2 by arrows i1 and i2. An increase in the current i1 moves the operating point of the diode D1 up its characteristic, thereby reducing the dynamic resistance of the diode D1. An increase in the current i2 moves the operating point of the diode D2 down its characteristic, thereby increasing the dynamic resistance of the diode D2. The fraction i2 of the current i therefore decreases relative to the fraction i1 with increasing current i, thereby limiting the output current from the limiter. In the limit, the fraction i2 tends merely to cancel the current ip, with the fraction i1 then tending to constitute substantially all of the input current i. It can thus be seen that the maximum limiting effect is determined by the value of the current ip. The limiter circuit can thus be adjusted to any given application by selecting an appropriate resistance for the resistor RP, and this is easily done by experiment. It has been found convenient to use Schottky diodes whose characteristics are identical, i.e. paired diodes which are delivered in a common package.

It will be observed that the current limiter circuit of the invention is very simple and that the output current/input current transfer characteristic thereof is automatically defined directly by the input current to be treated, i.e. in the application described, directly by the current delivered by the photodetector of the optical receiver.

We claim:

1. A current limiter circuit receiving an input current having a non-zero DC component whose value lies in a wide range of current values, and delivering a limited output current whose value lies in a narrower range of current values, the limiter circuit comprising a series connection of a first asymmetrical conductivity element followed by a second asymmetrical conductivity element which is followed in turn by a resistive element, the series connection extending between two poles of a voltage source so that a bias current flows through the asymmetrical conductivity elements and makes them conductive, with the input current being applied to the common point between the two asymmetrical conductivity elements and with the current-limited output being taken from the common point between the second asymmetrical conductivity element and the resistive element, the direction of the input current flow being such that it splits into two fractions, with one of the fractions being subtracted from the bias current in the second asymmetrical conductivity element, while the other fraction is added to the bias current in the first asymmetrical conductivity element, thereby increasing the dynamic resistance of the second asymmetrical conductivity element and reducing the dynamic resistance of the asymmetrical conductivity element, thus limiting the output current.

2. A limiter circuit according to claim 1, wherein the said asymmetrical conductivity elements are Schottky diodes.

3. The limiter circuit according to claim 2, wherein the diodes are paired.

4. An optical receiver comprising a photodetector for converting an incident optical signal into an electrical signal in the form of a current for delivery to a low impedance amplification stage for the electrical signal, a current limiter receiving an input current having a non-zero DC component whose value lies in a wide range of current values, and delivering a limited output current whose value lies in a narrower range of current values, said limiter circuit comprising a series connection of a first asymmetrical conductivity element followed by a second asymmetrical conductivity element followed in turn by a resistive element, the series connection extending between two poles of a voltage source so that a bias current flows through the asymmetrical conductivity elements and makes them conductive, with the input current being applied to the common point between the two asymmetrical conductivity elements and with the current-limited output being taken from the common point between the second asymmetrical conductivity element and the resistive element, the direction of the input current flow being such that it splits into two fractions, with one of the fractions being subtracted from the bias current in the second asymmetrical conductivity element, while the other fraction is added to the bias current in the first asymmetrical conductivity element, thereby increasing the dynamic resistance of the second asymmetrical conductivity element and reducing the dynamic resistance of the asymmetrical conductivity element, thus limiting the output current, and wherein the receiver has said limiter circuit interposed between the photodetector and the amplification stage to which the output current from the limiter circuit is applied with the input current to the limiter circuit being directly constituted by the current delivered by the photodetector.

* * * * *